United States Patent
Gudmunson et al.

(10) Patent No.: US 7,499,106 B1
(45) Date of Patent: Mar. 3, 2009

(54) METHOD AND SYSTEM FOR SYNCHRONIZING VIDEO INFORMATION DERIVED FROM AN ASYNCHRONOUSLY SAMPLED VIDEO SIGNAL

(75) Inventors: Daniel Gudmunson, Dripping Springs, TX (US); John Melanson, Austin, TX (US); Rahul Singh, Austin, TX (US); Ahsan Chowdhury, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 754 days.

(21) Appl. No.: 11/082,346

(22) Filed: Mar. 17, 2005

Related U.S. Application Data

(60) Provisional application No. 60/618,303, filed on Oct. 13, 2004.

(51) Int. Cl.
*H04L 7/00* (2006.01)
(52) U.S. Cl. .................. 348/536; 348/537; 348/547
(58) Field of Classification Search ............ 348/536, 348/547, 537, 441, 497; 386/85, 90; 345/213; 375/375, 376
See application file for complete search history.

(56) References Cited

U.S. PATENT DOCUMENTS

| | | | |
|---|---|---|---|
| 4,689,664 A | | 8/1987 | Moring et al. |
| 5,600,379 A | * | 2/1997 | Wagner .................... 348/497 |
| 5,652,773 A | * | 7/1997 | Lu .............................. 375/371 |
| 5,940,136 A | * | 8/1999 | Abe et al. ................... 348/537 |
| 6,038,276 A | * | 3/2000 | Dinh ........................... 375/376 |
| 6,208,671 B1 | | 3/2001 | Paulos et al. |
| 6,333,679 B1 | * | 12/2001 | Eriksson ...................... 331/25 |
| 6,489,901 B1 | | 12/2002 | Venkitachalam et al. |
| 6,642,863 B1 | | 11/2003 | Venkitachalam et al. |
| 6,833,875 B1 | * | 12/2004 | Yang et al. ................... 348/665 |
| 7,130,329 B2 | * | 10/2006 | Glazko et al. ............... 375/147 |
| 7,158,045 B1 | * | 1/2007 | Gudmunson et al. ... 340/825.21 |

OTHER PUBLICATIONS

Vankka, et al., "A GSM/EDGE/WCDMA Modulator With On-Chip D/A Converter for Base Stations", IEEE Transactions on Circuits and Systems, vol. 49, No. 10, Oct. 2002.

* cited by examiner

*Primary Examiner*—Victor R Kostak
(74) *Attorney, Agent, or Firm*—Andrew M. Harris; Mitch Harris, Atty at Law, LLC

(57) ABSTRACT

A method and system for synchronizing video information derived from an asynchronously sampled video signals provide a mechanism for using asynchronous sampling in the front-end of digital video capture systems. A ratio between the sampling clock frequency and the source video clock frequency is computed via an all digital phase-lock loop (ADPLL) and either a video clock is generated from the ratio by another PLL, a number to clock converter or the ratio is used directly to provide digital synchronization information to downstream processing blocks. A sample rate converter (SRC) is provided in an interpolator that either acts as a sample position corrector at the same line rate as the received video, or by introducing an offset in the ADPLL, the video data can be converted to another line rate via the SRC.

23 Claims, 5 Drawing Sheets

METHOD AND SYSTEM FOR SYNCHRONIZING VIDEO INFORMATION DERIVED FROM AN ASYNCHRONOUSLY SAMPLED VIDEO SIGNAL

CROSS-REFERENCE TO RELATED APPLICATIONS

This application is related to U.S. provisional application Ser. No. 60/618,303, filed Oct. 13, 2004 and from which it claims benefits under 35 U.S.C. §119(e).

The present application is also related to the following U.S. patent applications:

"INVERSE TRACKING OVER TWO DIFFERENT CLOCK DOMAINS" Ser. No. 10/964,556 filed on Oct. 13, 2004 and issued as U.S. Pat. No. 7,355,652; and "METHOD AND SYSTEM FOR VIDEO-SYNCHRONOUS AUDIO CLOCK GENERATION FROM AN ASYNCHRONOUSLY SAMPLED VIDEO SIGNAL", Ser. No. 11/082,347, filed concurrently herewith.

Each of the above-referenced patent applications has at least one inventor in common with the present application and are assigned to the same assignee. The specifications and drawings of each of the above-referenced patent applications are incorporated herein by reference.

BACKGROUND OF THE INVENTION

1. Field of the Invention

The present invention relates generally to audio/video (AV) systems, and more specifically, to a method and system for synchronizing downstream video data asynchronously sampled from a video signal.

2. Background of the Invention

Digital audio and video systems are prevalent in the areas of home entertainment, professional production of multimedia and computer reproduction and generation of multimedia sources. In particular, systems that record a video stream are frequently coupled to source devices such as cameras and also produced from AV playback devices such as DVD and CD players.

It is necessary to receive, resynchronize and sometimes resample a video signal for recording or processing purposes, whether by a general-purpose computing device, a dedicated video processing device, or a dedicated video recording device. The source video rate may not match the recording or processing video rate, and even if the rates did match, it would be desirable to asynchronously sample the video signal, as will be pointed out in detail below.

Traditionally, video clock sources are sampled synchronously, with a source-locked video clock. The source-locked video clock used to sample the video signal is generated by a phase-lock loop (PLL) that locks to the incoming line rate, frame rate, or combination of both. While source-locking provides a video clock that is free of drift or "slipping"—at least for relatively clean video signals, video degradation is present in the sampled video due to jitter and other noise that is introduced or cannot be removed by the PLL. In particular, most composite video signals have events such as vertical blanking interval (VBI) that require special circuits in the PLL to avoid disrupting the lock signal and the frequency of the video clock signal of the source may vary from source to source over a fairly wide margin. PLLs that handle such variable signals and disruptive events require a reasonably wide loop bandwidth for capture and lock retention.

In general, less noise and jitter is generally provided by asynchronously sampling a signal, rather than synchronously sampling a signal, as a very stable local reference clock may be employed. A stable sampling clock can be designed to minimize environmentally-introduced noise, be ideally terminated to the sample clock input and be otherwise optimized for the video sampling circuit. However, asynchronous sampling of signals with accurate phase preservation requires a high oversampling factor, which is typically impractical for video sources. In particular, the recovery of the synchronization elements in a video signal (such as the luminance and chrominance carriers that require phase accuracy on the order of two degrees or less) would require a sampling clock on the order of 1 Ghz in order to completely preserve the video signal.

When the desired output video rate does not match the incoming line clock rate, it also is necessary to not only synchronize the output video data, but the data must be converted to the new rate. As pointed out above, there are significant advantages to asynchronously sampling a video signal, and further advantages are present in sample rate conversion schemes, as the more stable and noise-free sampling clock on which the samples are based leads to more stable input data for the sample rate conversion process. Any jitter or frequency variation in the sampling timebase causes error in the conversion due to uneven sample spacing in the conversion input data.

Therefore, it would be desirable to provide a method and system for synchronizing downstream video information obtained by asynchronously sampling a video source. It would further be desirable to provide sample rate conversion of asynchronously sampled video data.

SUMMARY OF THE INVENTION

The above stated objectives are achieved in a method and system for synchronizing video information obtained from an asynchronously sampled video signal.

A novel circuit computes the ratio of the sampling clock frequency to the video source clock frequency. Video synchronization information can then be generated from the sampling clock using the ratio, which can be provided as a generated video synchronization signal or as numeric input to an encoder without physical generation of a video clock signal.

A time-varying filter is used as an interpolator to either correct the sampled video data based on detected variation in the source video clock or to convert the video data to an entirely different video rate, forming a sample rate converter (SRC).

A phase-lock loop is used to compute the ratio by comparing the input video data synchronization information to the output of a local timebase formed from a numerically-controlled oscillator driven by the ratio as an input. The closed loop circuit causes the ratio output to stabilize around a value corresponding to the ratio of the sampling clock to the video clock.

The computed video ratio can then be used to generate a physical video line clock signal and/or the ratio can be used directly as an input to another numerically-controlled oscillator to provide a numeric value that adjusts the coefficients of a time-varying filter that converts the video rate of the video data or stabilizes the data at the same rate as the incoming stream.

The ratio can also be used as a direct input to a digital video encoder that uses the digital ratio information (or the output of a fractional synthesizer having the ratio as an input) to compute the encoded data output, in which case a physical video clock output is never generated at all.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and system that produce a new video synchronization reference from asynchronously sampled video data. The sampled video data is filtered to extract synchronization information, and then a number corresponding to the ratio between the sampling clock frequency and the source video line clock (vertical or horizontal) is obtained by the use of an all-digital phase-lock loop (ADPLL) that compares the output of a numerically controlled oscillator to the synchronization information that was extracted from the sampled video data.

From the ratio (referred to as "video ratio"), a new physical video clock can be generated and/or the video ratio may be used in further numeric processing such as sample rate conversion and video data encoding. In some embodiments of the invention, a physical video clock signal is never generated, but rather the ratio and other numeric computation resulting from the ratio are used in the further stages of video processing to synchronize the video data.

The present invention has applicability any time a source video signal is to be sampled and further processed and provides benefits in that the video sampling can be carried out asynchronously while maintaining synchronization between the sampled video data and the video line rate, with the option of converting the video data to a new line rate.

Figure 1:
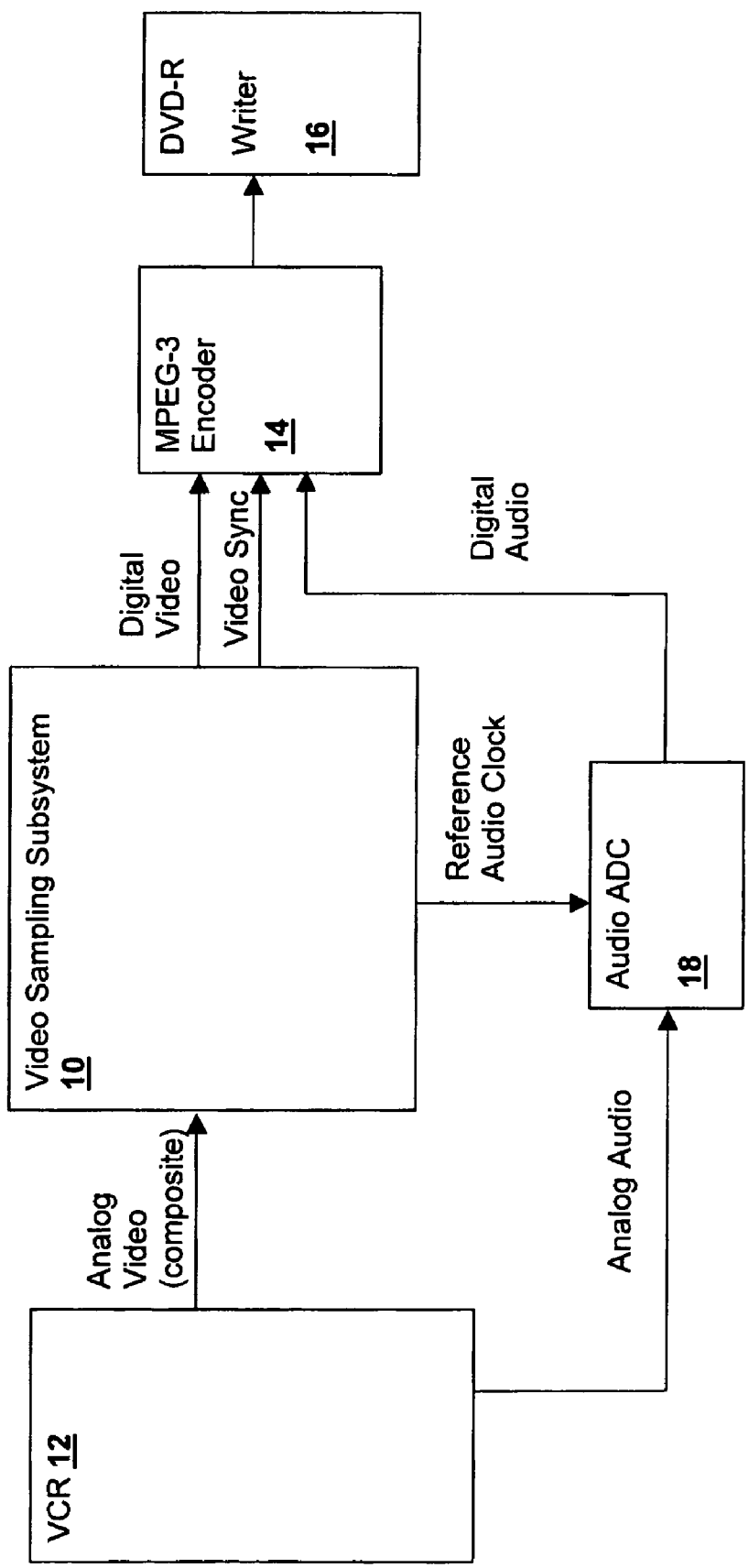
FIG. 1 is a block diagram depicting application of a system 10 in accordance with an embodiment of the present invention.

Referring now to FIG. 1, an application of a video sampling subsystem 10 in accordance with an embodiment of the invention is illustrated. The depicted application is video capture of a video cassette recorder (VCR) 12 output for storage on a digital versatile disc (DVD) via a DVD-R writer 16. Video processing subsystem 10 receives a composite video signal such as an NTSC or PAL signal from VCR 12 and generates video synchronization information (Video Sync) that is provided to MPEG-3 Encoder 14, and which may be a parallel multi-bit number indicating the video ratio, an absolute phase ramp (phase/time ramp), other numeric indicator of the video rate or may be a physical video clock signal.

In particular, if the sample-rate conversion process detailed hereinafter below is incorporated within the mathematical logic that implements the encoding process and that logic is clocked with the video data sampling clock, then no physical video line-locked clock is needed, as the video sync information can be the video ratio or other numeric indicator of the relationship between the sampling rate and the video clock.

An audio analog-to-digital converter (ADC) 18 receives the analog audio signals from VCR 12. ADC 18 should be understood to include anti-aliasing filters and data conversion elements to provide a proper digital audio output to MPEG-3 encoder 14, which may be wide parallel data, or a serial signal such as an S/P-DIF signal.

MPEG-3 encoder 14 receives the sampled digital video produced by video sampling subsystem 10, which may be wide data or a serial digital interface such as DV-I. MPEG-3 encoder bundles the received digital audio and video into an encoded and compressed file stream for storage by DVD-R writer 16.

Figure 2:
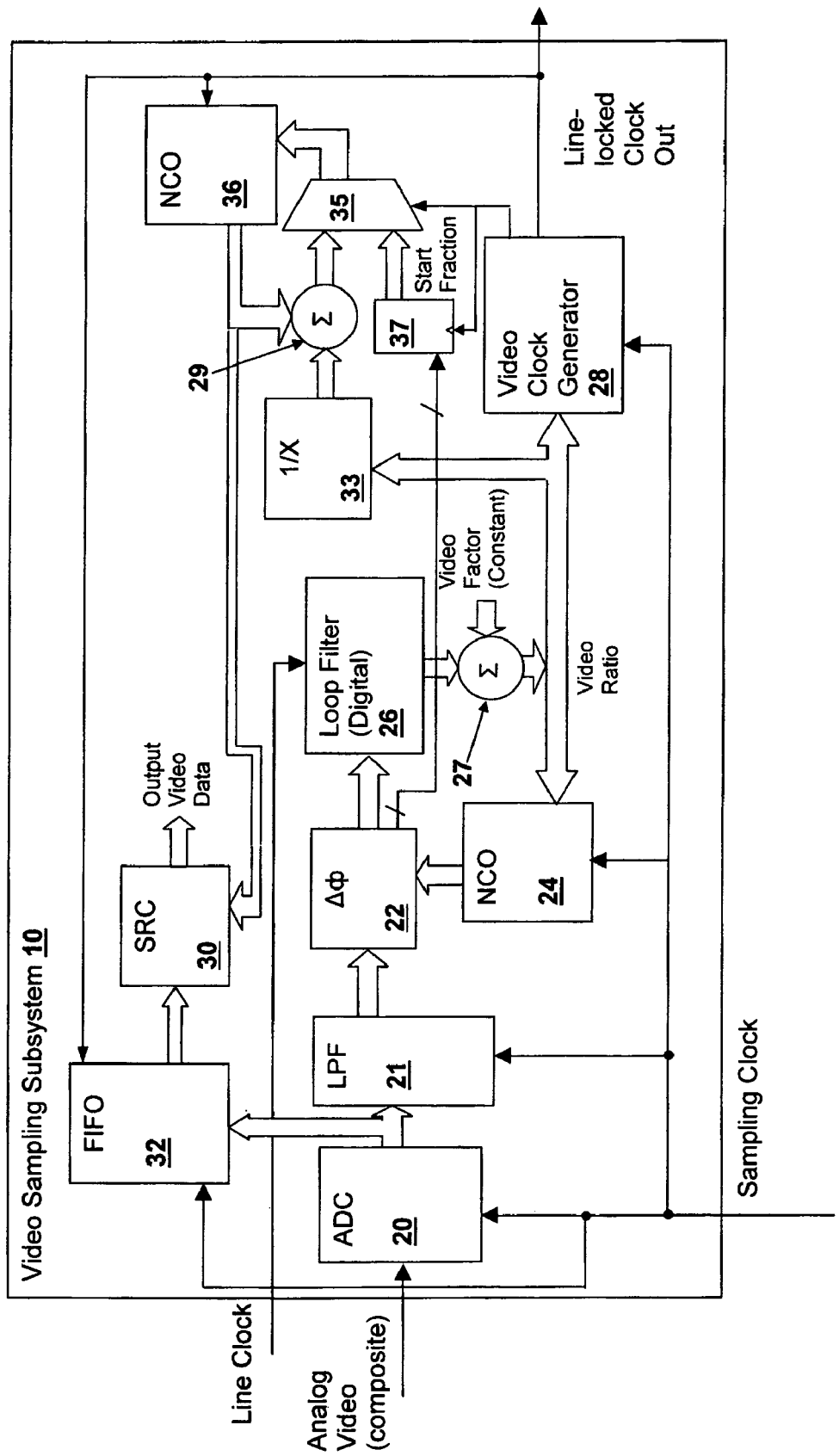
FIG. 2 is a block diagram depicting details of system 10.

Referring now to FIG. 2, details of system 10 in accordance with an embodiment of the invention are shown. The analog (composite) video input signal is received and converted by an ADC 20 operating at the frequency of a provided sampling clock. The output of ADC 20 is digitally-filtered by low-pass filter (LPF) 21, which removes video and audio information, leaving only synchronization information, which can be at the line rate or the frame rate (or field rate). The filtered data is passed to a phase detector 22 which compares the phase of the video synchronization data to the digital output of a local timebase formed by a numerically controlled oscillator (NCO) 24 and provides phase-correction error output to a loop filter 26 that closes the PLL by providing the control input to NCO 24 through an adder 27. Adder 27 receives a number constituting a video factor that is added to the output of loop filter 26 to generate a frequency offset. The video factor is determined from the known difference between the video source frequency and the sampling frequency and may be adjusted programmatically to adapt to various video rates.

The output of adder 27 is a slowly-varying or essentially constant number corresponding to the ratio between the sampling clock rate and the video clock rate, labeled "video ratio". Loop filter 26 receives a line clock signal derived from other processing circuits that is synchronous with the video source line frequency. The line clock signal is used to synchronize the processing in the loop filter to avoid aliasing error that would occur through phase detector 22 due to the difference between the source video sync rate and the sync rate as sampled and appear as a "beat frequency" at the output of loop filter 26. Such beat frequencies can approach DC values and therefore are eliminated rather than filtered.

The video ratio is also provided to an inverse function block 33 that generates a numeric output functionally inverse to the video ratio and therefore corresponding to a second ratio of the video source line rate to the sampling clock frequency. The second (inverted) ratio provides an input to a second NCO 36 through multiplexer 35. NCO 36 generates a number (a) that controls a sample rate converter (SRC) 30 by adjusting coefficients of an interpolation filter. The second NCO 36 output is further supplied as feedback to an adder 29 that combines the inverse ratio from inverse function block 33 in combination with the output of NCO 36 to provide the input to NCO 36, when multiplexer 35 is in its normal operating state. The select input of multiplexer 35 is pulsed at the start of each line (or frame or field if the ratio is based on the frame or field) and causes a start fraction value to be loaded into NCO 36 at the beginning of each video sync interval. The start fraction is a value dependent on the sync rate of the incoming video and the desired output sync rate, which is obtained by latching a remainder value out of phase detector 22 via a latch 37. The feedback through adder 29 causes NCO 36 to generate a linearly varying progressive phase number a that is used by SRC 30 to interpolate digital video samples received from ADC 20 and stored in FIFO 32 to be synchronized with the new line rate.

While the above described circuits use a digital NCO 24 and a digital phase detector 22 that receives a waveform representation (generally parallel binary data that represents a ramp signal integrator output for phase-locking with the filtered input video sync data, which is also parallel digital data), other circuit embodiments, both digital and analog are contemplated by the present invention. In particular, NCO 24 may generate an actual signal waveform that is phase compared with either a digital or analog filtered sync signal and NCO may be replaced with a voltage-controlled oscillator (VCO) with an appropriate analog loop filter and analog adders/multipliers, or portions of the above-circuits may be implemented in analog circuits with appropriate A/D or D/A converters between disparate blocks. Also, a digital timebase input to phase detector 22 may be any digital representation of phase, which may be a parallel multi-bit number representing an absolute phase ramp (phase/time ramp) or other numeric indicator of the phase and frequency, such as numbers indicating an edge position and pulse width, etc.

The present invention principally concerns the synchronization of asynchronously sampled video data, and embodiments of the present invention may or may not generate a physical video clock signal locked to the source video clock, as long as the ratio information from which it is obtained can be used to provide video synchronization information to subsequent processing blocks.

Figure 3:
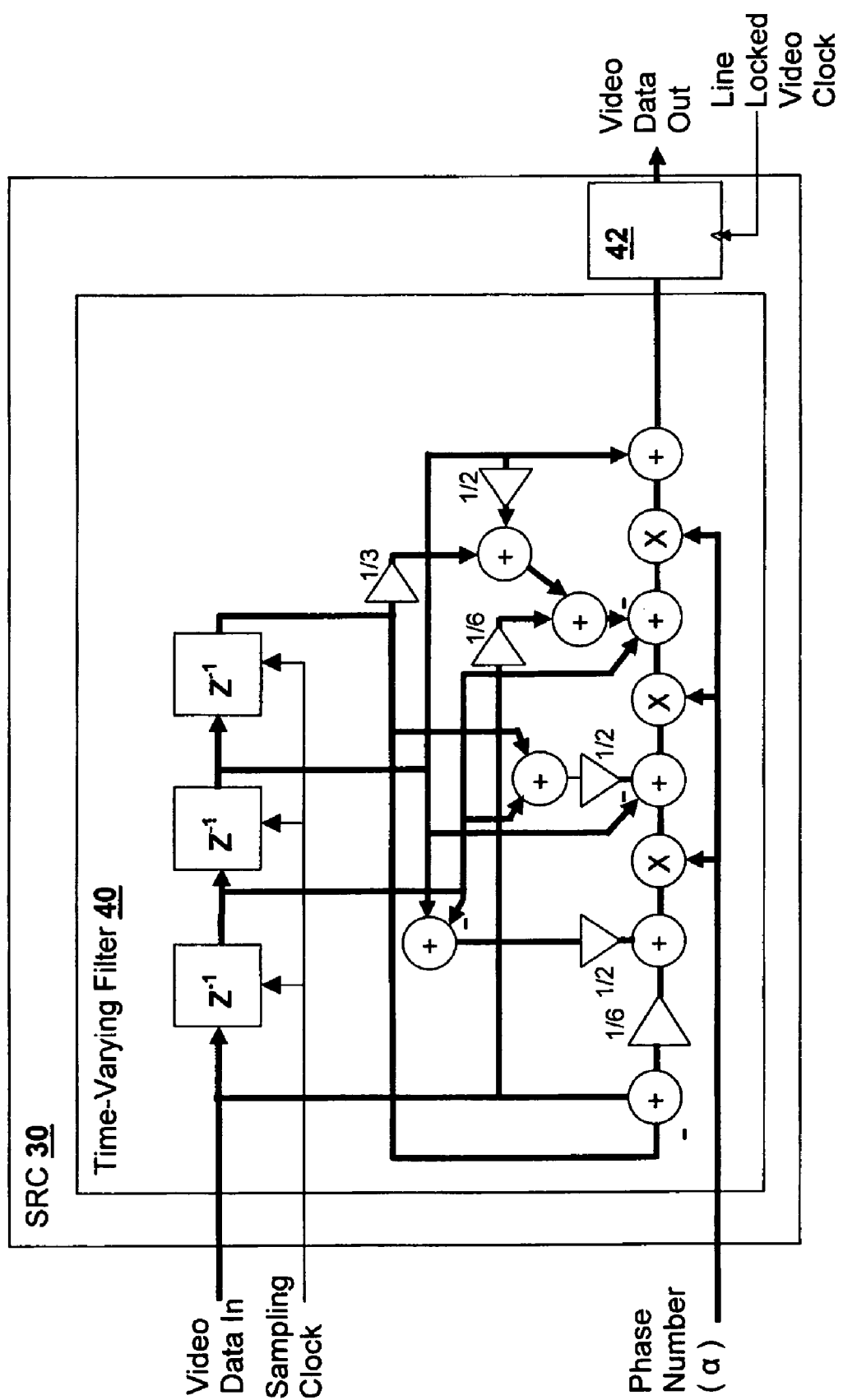
FIG. 3 is a block diagram showing details of sample rate converter (SRC) of FIG. 2.

Referring now to FIG. 3, details of SRC 30 are shown. A time-varying filter 40 implements an interpolator that receives the phase number a which adjusts the filter coefficients to interpolate the incoming video data to a new phase space. The stages of the filter are clocked by the sampling clock and the output of the filter is latched by a latch 42 clocked by the line-locked video clock produced by video clock generator 28, so that the output video data samples are synchronous with the line-locked clock.

Time-varying filter 40 may be any interpolation filter that meets the quality requirements for the video data output, but is depicted as a third-order (cubic) LaGrange interpolator that implements the Z-transform:

$$H(z) = p_3(\alpha)z^{-3} + p_2(\alpha)z^{-2} + p_1(\alpha)z^{-1} + p_0(\alpha)$$

$$\text{where } p_k(\alpha) = -\prod_{\substack{n=0 \\ n \neq k}}^{3} (\alpha - n)/(k - n)$$

The resulting action of the filter third-order interpolates the input samples at a progressive phase factor specified by the phase difference between the sampling clock and the line-locked clock reference, which translates the sample rate of the incoming data to synchronize the output video data with the generated video line-locked clock.

Further details of SRC converter logic, phase control and filter implementation are disclosed in: "ASYNCHRONOUS SAMPLE RATE CONVERTER", U.S. Pat. No. 6,208,671 to Paulos, et al.; "VARIABLE DUTY CYCLE RESAMPLING CIRCUITS AND METHODS AND SAMPLE RATE CONVERTERS USING THE SAME", U.S. Pat. No. 6,489,901 to Venkitachalam, et al.; and "SAMPLE RATE CONVERTERS USING VIRTUAL SAMPLE RATES AND ANALOG TO DIGITAL AND DIGITAL TO ANALOG CONVERTERS USING THE SAME", U.S. Pat. No. 6,642,863, also to Venkitachalam, et al. The specifications and drawings of the above-referenced patents are incorporated herein by reference.

Figure 4:
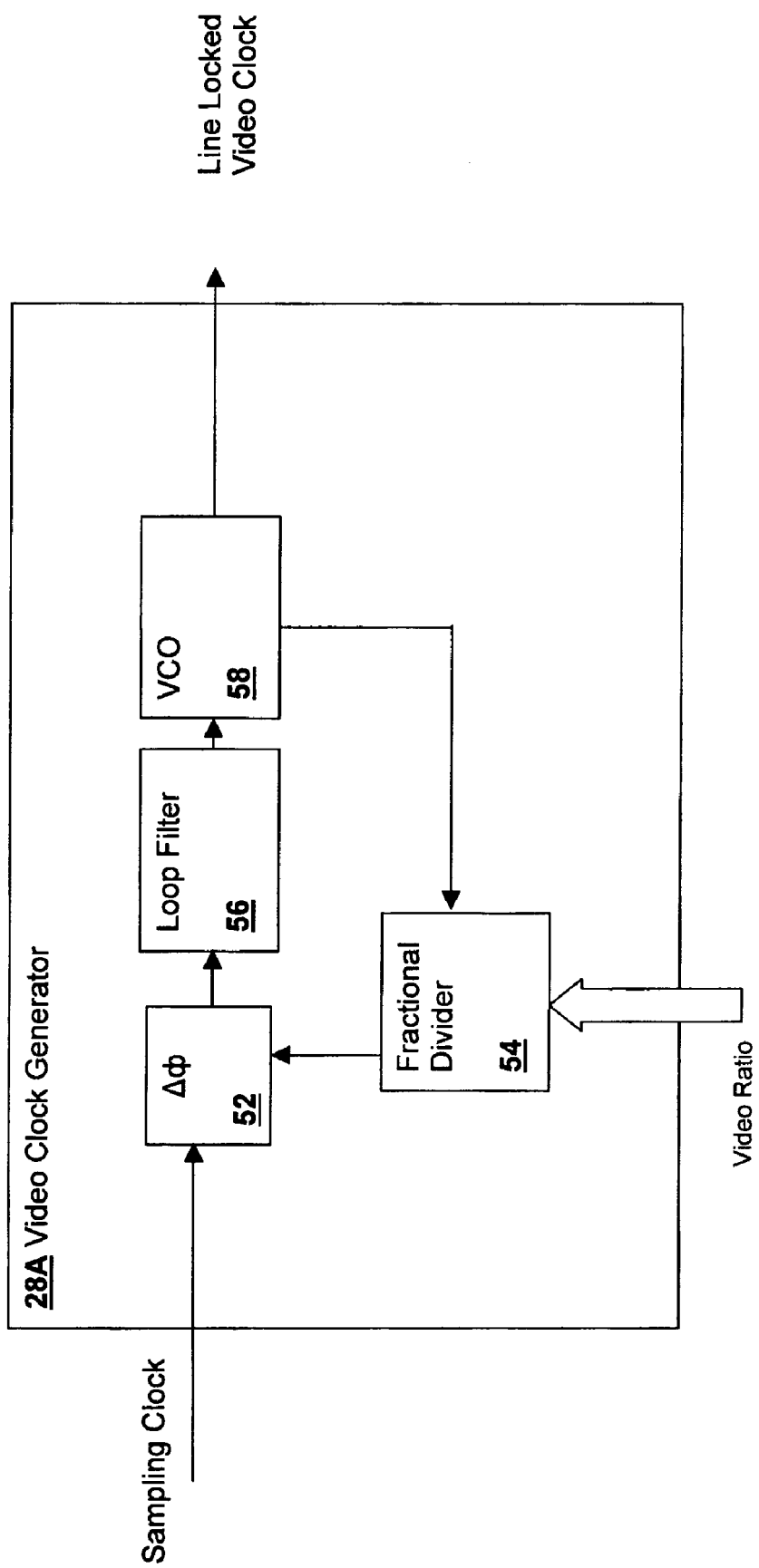
FIG. 4 is a block diagram showing details of an embodiment of video clock generator 28 of FIG. 2.

Referring now to FIG. 4, details of a video clock generator 28A that may be used to implement video clock generator 28 of FIG. 2 is depicted in a block diagram. A fractional divider 54 receives the sampling clock/audio clock frequency ratio and divides the output of a voltage controlled oscillator (VCO) 58 to match phase and frequency with the sampling clock input (which may be prescaled from the master sampling clock). Fractional divider 54 is a delta/sigma circuit that generates an average pulse signal corresponding to the input (VCO 58 output) value divided by the divisor (video ratio) value. A loop filter 56 provides the voltage control input to VCO 58 to close the loop, so that VCO 58 generates a video clock having a frequency equal to the sampling clock rate divided by the video ratio.

Figure 5:
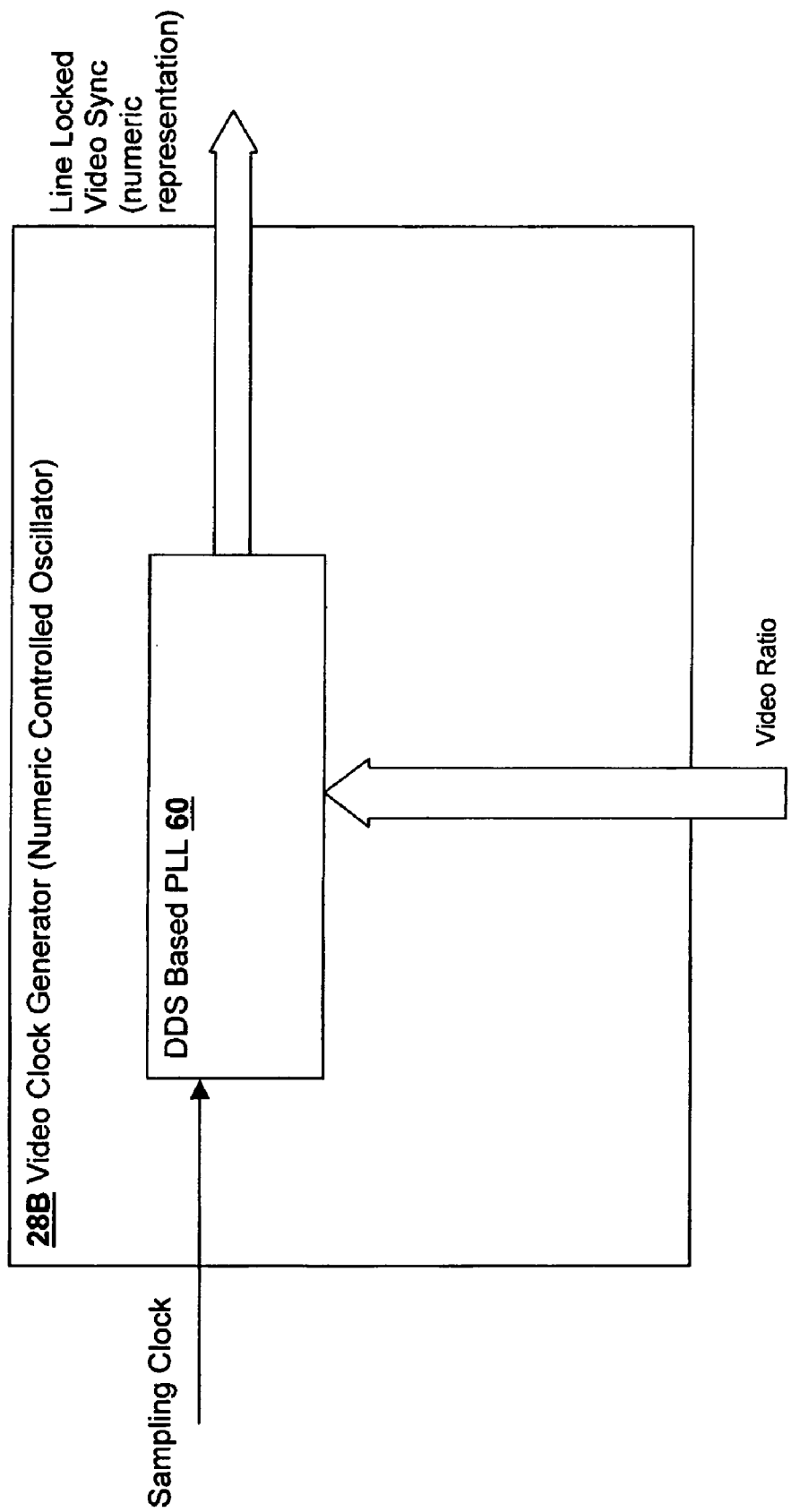
FIG. 5 is a block diagram showing details of an alternative embodiment of video clock generator 28 of FIG. 2.

Referring now to FIG. 5, another video clock generator 28B that may be used to implement video clock generator 28 of FIG. 2 is shown. Video clock generator 28B consists of a number to clock converter or "numerically controlled oscillator" (NCO) 60 that generates the line-locked video clock purely in the digital domain. Generally, NCO 60 will be a direct digital synthesizer (DDS) based PLL that produces a stable reference video clock signal from the fractional ratio input.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for synchronizing video data sampled by a fixed-frequency sampling clock, said method comprising:
    accepting said video data at an input of a phase detector;
    performing a phase comparison of a locally-generated timebase with a video source clock derived from said video data, and wherein a phase and a frequency of the video source clock are independent of any result of the phase comparison;
    filtering a result of said phase comparison;
    computing a ratio of a frequency of said sampling clock to the frequency of said video source clock from a result of said filtering; and
    synchronizing said video data with a reference generated from said ratio without changing the phase or the frequency of the video source clock, and wherein a frequency of said fixed sampling clock is independent of any result of said phase comparison.

2. The method of claim 1, wherein performing a phase comparison compares a numeric timebase representation with said video source clock and further comprising adjusting a frequency of said numeric timebase representation in conformity with a result of said filtering.

3. The method of claim 1, wherein the phase comparison compares a timebase signal with the video source clock and further comprising adjusting a frequency of the signal in conformity with a result of said filtering.

4. The method of claim 1, wherein the reference is a video clock signal and further comprising generating said video clock signal from said ratio via a fractional oscillator and wherein said synchronizing is performed in conformity with the video clock signal.

5. The method of claim 1, wherein the reference is a numeric representation of video synchronization information and further comprising generating said numeric representation of said video synchronization information from the ratio via a direct digital synthesis phase-lock loop.

6. The method of claim 5, further comprising encoding the video data and wherein the encoding is performed in conformity with the numeric representation of the video synchronization information.

7. The method of claim 1, further comprising converting a rate of said video data to a rate differing from a rate of said sampling clock to form a new video data stream synchronized with said reference.

8. The method of claim 7, wherein said converting comprises interpolating said video data with a time-varying filter having coefficients determined in conformity with said ratio.

9. The method of claim 8, further comprising:
computing a numeric inverse of said ratio; and
generating said coefficients from a numeric oscillator that receives said numeric inverse as a frequency control input.

10. The method of claim 9, further comprising loading a start value for said frequency control input of said numeric oscillator from a remainder result of said phase comparison.

11. A circuit for synchronizing video data sampled by a fixed-frequency sampling clock, comprising:
a video data input for receiving said video data;
a local timebase;
a phase detector coupled to said video data input and said local timebase for comparing a video source clock derived from said video data to said local timebase, wherein a phase and a frequency of the video source clock are independent of changes in the output of the phase detector;
a loop filter for filtering an output of said phase detector and providing an input to said local timebase, whereby said local timebase is phase-locked to said video source clock; and
a ratio generator coupled to said loop filter for generating a first ratio of a frequency of said sampling clock to the frequency of said video source clock, whereby said video data can be synchronized to a reference generated in conformity with said ratio without changing the phase or the frequency of the video source clock.

12. The circuit of claim 11, wherein said local timebase is a numeric oscillator having a digital frequency control input coupled to said ratio generator for adjusting a frequency of said local timebase.

13. The circuit of claim 11, wherein said local timebase is an oscillator providing a clock output to an input of said phase detector.

14. The circuit of claim 11, further comprising a fractional oscillator having a frequency control input coupled to an output of said ratio generator for generating a video synchronization clock signal.

15. The circuit of claim 11, further comprising a numeric oscillator comprising a direct digital synthesis phase-lock loop having a frequency control input coupled to an output of said ratio generator for generating numeric video synchronization information.

16. The circuit of claim 15, further comprising a video encoder having a data input for receiving unencoded video data and a synchronization input coupled to an output of said numeric oscillator for providing synchronization information for synchronizing encoding of the unencoded video data.

17. The circuit of claim 11, further comprising a sample rate converter for converting a rate of said video data to a rate differing from a rate of said sampling clock to form a new video data stream synchronized with said reference.

18. The circuit of claim 17, wherein said sample rate converter comprises an interpolation filter having coefficients determined in conformity with said ratio.

19. The circuit of claim 18, further comprising:
a numeric inverter for computing a numeric inverse of said ratio; and
a numeric oscillator that receives said numeric inverse as a frequency control input and has an output coupled to said interpolation filter for providing values of said coefficients.

20. The circuit of claim 19, further comprising:
a latch for capturing a remainder value provided from a remainder output of said phase detector; and
a load circuit for loading an initial value into said frequency control input of said numeric oscillator, and coupled to said remainder output for determining said initial value in conformity with said remainder value.

21. The circuit of claim 11, further comprising a digital low-pass filter for filtering said video data to remove video information while retaining video synchronization information, whereby said phase detector compares said video synchronization information to said local timebase.

22. The circuit of claim 11, wherein said loop filter is a digital filter synchronized with a reconstructed version of said video source clock.

23. A circuit for synchronizing video data sampled by a fixed-frequency sampling clock, comprising:
a video data input for receiving said video data;
a digital filter for generating a representation of a video source clock of said video data;
a first numeric oscillator for providing a local timebase;
a phase detector coupled to said digital filter for receiving said video source clock representation and further coupled to an output of said first numeric oscillator, wherein a phase and a frequency of the video source clock representation are independent of any output of the phase detector;
a loop filter for filtering an output of said phase detector;
a ratio generator coupled to an output of said loop filter for generating a ratio of a frequency of said sampling clock to a frequency of said video source clock;
a video clock generator for generating a video clock synchronized with a video source clock of said video data;
a numeric inverter for computing a numeric inverse of said ratio;
a second numeric oscillator having a frequency control input coupled to an output of said numeric inverter; and
a sample rate converter having a data input coupled to said video data input, a clock input coupled to an output of said video clock generator and a synchronization input coupled to an output of said second numeric oscillator, wherein the sample rate converter synchronizes the video data to a rate specified by the output of the second numeric oscillator without changing a phase or the frequency of the video source clock.

* * * * *